United States Patent
Refai-Ahmed et al.

(10) Patent No.: US 10,096,502 B2
(45) Date of Patent: Oct. 9, 2018

(54) METHOD AND APPARATUS FOR ASSEMBLING AND TESTING A MULTI-INTEGRATED CIRCUIT PACKAGE

(71) Applicant: Xilinx, Inc., San Jose, CA (US)

(72) Inventors: Gamal Refai-Ahmed, Santa Clara, CA (US); Suresh Ramalingam, Fremont, CA (US); Mohsen H. Mardi, Saratoga, CA (US); Tien-Yu Lee, San Jose, CA (US); Ivor G. Barber, Los Gatos, CA (US); Cheang-Whang Chang, Mountain View, CA (US); Jaspreet Singh Gandhi, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 18 days.

(21) Appl. No.: 15/360,187

(22) Filed: Nov. 23, 2016

(65) Prior Publication Data

US 2018/0144963 A1    May 24, 2018

(51) Int. Cl.
| | |
|---|---|
| *B23P 21/00* | (2006.01) |
| *H01L 21/673* | (2006.01) |
| *H01L 21/67* | (2006.01) |
| *H01L 23/00* | (2006.01) |
| *H01L 23/31* | (2006.01) |
| *H01L 23/367* | (2006.01) |
| *H01L 21/48* | (2006.01) |
| *H01L 21/56* | (2006.01) |

(52) U.S. Cl.
CPC .... *H01L 21/67333* (2013.01); *H01L 21/4853* (2013.01); *H01L 21/4882* (2013.01); *H01L 21/563* (2013.01); *H01L 21/67109* (2013.01); *H01L 23/3185* (2013.01); *H01L 23/3675* (2013.01); *H01L 24/16* (2013.01); *H01L 2224/16227* (2013.01)

(58) Field of Classification Search
CPC .......... B25B 11/02; B25B 11/00; B23P 19/00; B23P 19/10; B23Q 3/06; H01L 21/02367
See application file for complete search history.

(56) References Cited

U.S. PATENT DOCUMENTS

| | | | | |
|---|---|---|---|---|
| 2,754,708 | A * | 7/1956 | Peterson | B25B 1/2421 269/224 |
| 4,572,564 | A * | 2/1986 | Cipolla | B25B 1/2421 269/266 |
| 5,984,293 | A * | 11/1999 | Abrahamson | B23Q 1/035 269/236 |
| 2011/0291342 | A1* | 12/2011 | Gindy | B25B 1/2421 269/266 |

\* cited by examiner

*Primary Examiner* — Lee D Wilson
(74) *Attorney, Agent, or Firm* — Robert M. Brush

(57) ABSTRACT

An example clamping assembly tray for packaging a semiconductor device includes a frame having a bottom surface and side walls extending from the bottom surface that define a cavity; and a compressible member disposed on the bottom surface of the frame within the cavity, where a top portion of the compressible member provides a support surface for supporting the semiconductor device, the support surface being between the bottom surface and a top edge of the side walls.

16 Claims, 6 Drawing Sheets

METHOD AND APPARATUS FOR ASSEMBLING AND TESTING A MULTI-INTEGRATED CIRCUIT PACKAGE

TECHNICAL FIELD

Examples of the present disclosure generally relate to electronic circuits and, in particular, to a method and apparatus for assembling and testing a multi-integrated circuit (IC) package.

BACKGROUND

An integrated circuit (IC) package can include multiple IC dies disposed on a substrate. A heat spreader can be mounted to the substrate to cover the multiple IC dies. A thermal interface material can be disposed between the IC dies and the heat spreader. An assembly process for attaching a heat spreaders to IC packages includes a step of applying a mechanical force to the heat spreaders at higher than room temperature. The IC packages can have some warpage at room temperature. The curvature of the IC packages changes when heated during the assembly process. Further, there are variations in the flatness of the heat spreader, the assembly tray supporting the IC packages, and weights used to apply force to the heat spreaders. These variations in flatness, when combined with the change in curvature of the IC packages during assembly, result in application of non-uniform force to the IC packages and non-uniform heating of the IC packages. The non-uniform application of force and heating can cause mechanical stresses in the IC packages, resulting in cracking and/or delamination. Further, the thickness of the thermal interface material will not be uniform, creating areas of higher thermal resistance in certain locations of the IC packages. Thus, it is desirable to reduce or eliminate mechanical stresses during an assembly process that integrates a heat spreader and/or stiffener with IC packages.

SUMMARY

Techniques for assembling and testing a multi-integrated circuit (IC) package are described. In an example, a clamping assembly tray for packaging a semiconductor device includes a frame having a bottom surface and side walls extending from the bottom surface that define a cavity; and a compressible member disposed on the bottom surface of the frame within the cavity, where a top portion of the compressible member provides a support surface for supporting the semiconductor device, the support surface being between the bottom surface and a top edge of the side walls.

In another example, an apparatus for assembling an IC package includes a frame having a bottom surface and side walls extending from the bottom surface that define a cavity; a compressible member disposed on the bottom surface of the frame within the cavity, where a top portion of the compressible member provides a support surface, the support surface being between the bottom surface and a top edge of the side walls; a semiconductor device disposed on the support surface within the cavity; and a lid disposed on the semiconductor device.

In another example, a method of assembly a plurality of IC packages includes forming a plurality of semiconductor devices each having a plurality of IC dies mounted to a substrate; placing the semiconductor devices on a compressible member in cavities of a clamping assembly tray; depositing thermal interface material on plurality of IC dies of each of the plurality of semiconductor devices; placing a lid on each of the semiconductor devices; and heating the semiconductor devices while applying pressure to the lids to form the plurality of IC packages.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
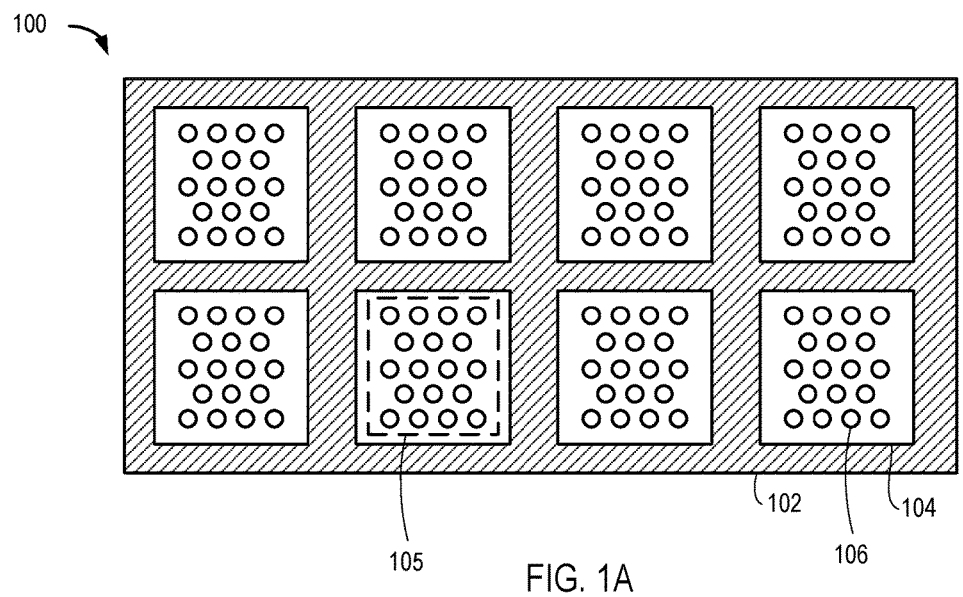
FIG. 1A is a top view of a clamping assembly tray for use in forming a plurality of integrated circuit (IC) packages according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1A is a top view of a clamping assembly tray 100 for use in forming a plurality of integrated circuit (IC) packages according to an example. The clamping assembly tray 100 includes a frame 102, which is formed of metal. The frame 102 includes a plurality of cavities 104. In the example, the frame 102 includes eight cavities 104 arranged in four columns and two rows. In general, the frame 102 can include more or less than eight cavities arranged in at least one row and at least one column. Each of the cavities 104 includes a compressible member 105 disposed on the bottom surface thereof. In the example shown, the compressible member 150 comprises a plurality of springs 106 formed on the bottom surface thereof. In another example, the compressible members 105 can be a plurality of other elastic objects, a material (e.g., memory material that can store and release stresses and is capable of restoration to an initial form), or the like. Top portions of the springs 106 form a surface within each of the cavities 104 to support a semiconductor device during an IC package assembly process. The clamping assembly tray 100 includes a cover (not shown) that covers the cavities 104 and includes weights for each of the cavities 104, as described further below.

Figure 1B:
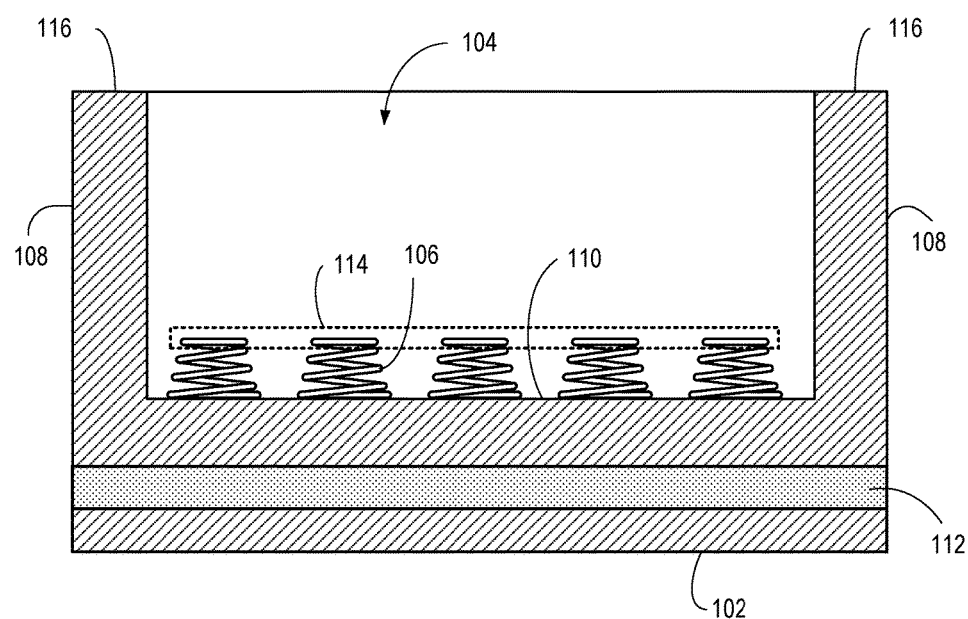
FIG. 1B is a cross-sectional view of a cavity within the frame of the clamping assembly tray of FIG. 1A.

FIG. 1B is a cross-sectional view of a cavity 104 within the frame 102 of the clamping assembly tray 100 of FIG. 1A. The frame 102 includes a bottom 110 and side-walls 108 extending from the bottom 110 that form the cavity 104. Top edges of the side-walls 108 form a rim 116 of the cavity 104. The springs 106 are disposed on the bottom 110 of the frame 102 between the side-walls 108. The springs 106 can be secured to the bottom surface 110 by welds, solders, or the like. The frame 102 can include a heating element 112 disposed below the bottom surface 110. The heating element 112 can be a foil heater or the like. Top portions of the springs 106 define a support surface 114 (shown by a dotted-line rectangle) that is disposed between the bottom surface 110 and the rim 116.

Figure 1C:
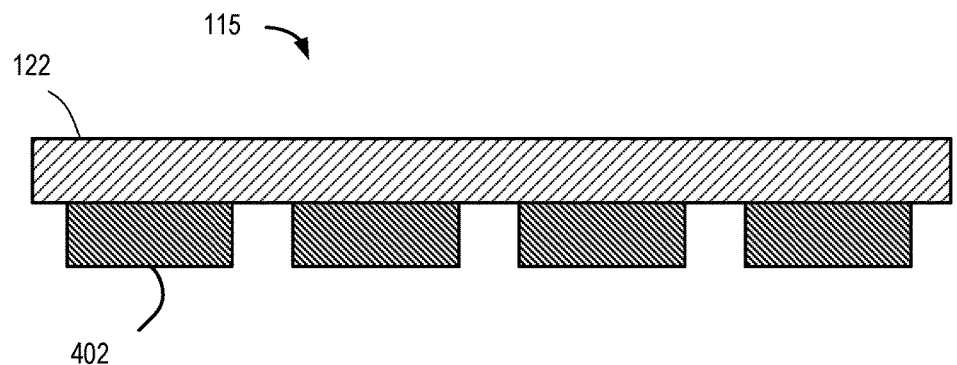
FIG. 1C is a cross-sectional view of a cover for a clamping assembly tray according to an example.

FIG. 1C is a cross-sectional view of a cover 115 for the clamping assembly tray 100 according to an example. The cover 115 includes a top portion 122 and a plurality of weights 402. The weights 402 are integral with the top portion 122. The weights 402 are disposed on the top portion 122 to align with the cavities 104 of the frame 102 when the cover 115 is placed on the frame 102.

Figure 1D:
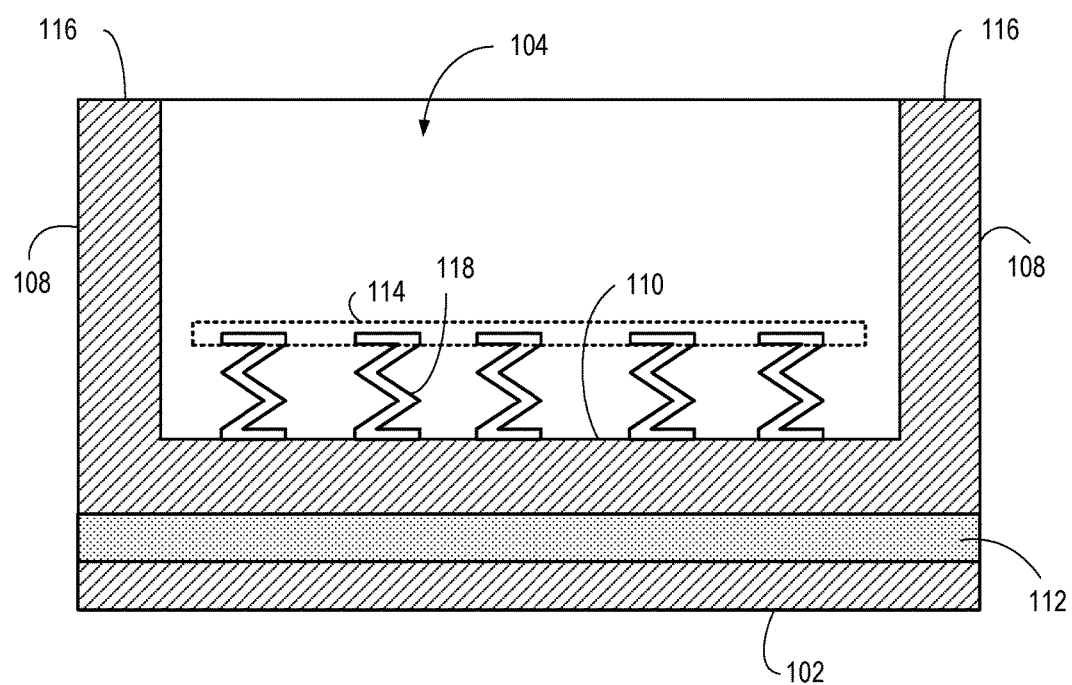
FIG. 1D is a cross-sectional view of a cavity within the frame of the clamping assembly tray of FIG. 1A according to another example.

FIG. 1D is a cross-sectional view of the cavity 104 within the frame 102 of the clamping assembly tray 100 of FIG. 1A in accordance with another example. Elements of FIG. 1D that are the same or similar to those of FIG. 1B are designated with identical reference numerals. In the present example, the compressible member 105 comprises a plurality of elastic objects 118, rather than the plurality of springs 106. In general, the elastic objects 118 can have various shapes (e.g., an accordion shape is shown in FIG. 1D) and are configured to store and release stresses similar to springs. Each of the elastic objects 118 is configured to restore to an initial shape absent applied force. The elastic objects 118 can be formed of metal or other type of heat conducting material.

Figure 1E:
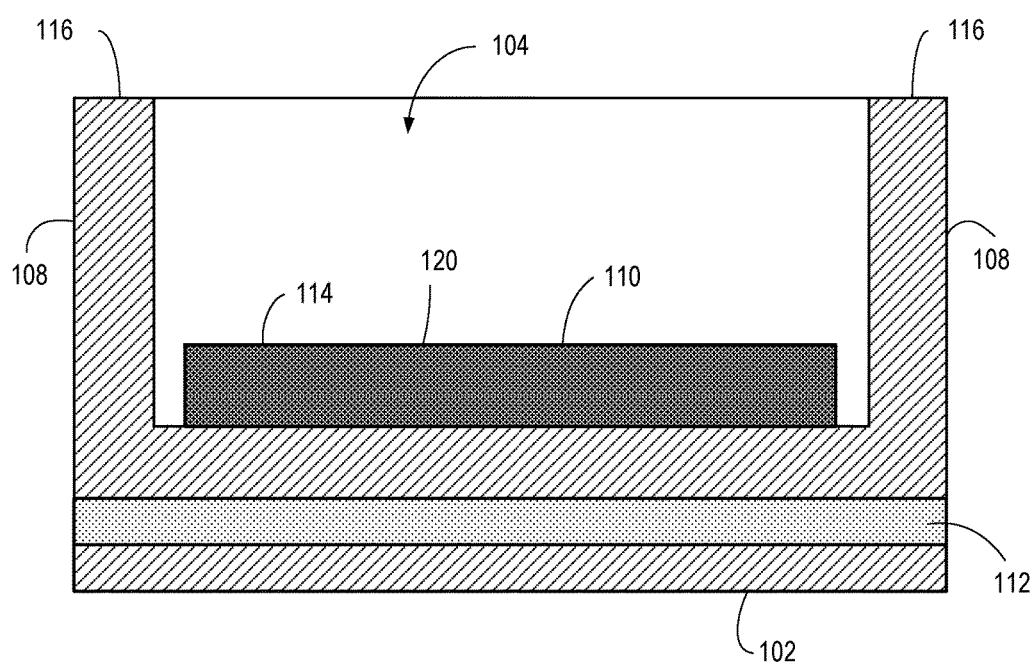
FIG. 1E is a cross-sectional view of a cavity within the frame of the clamping assembly tray of FIG. 1A according to another example.

FIG. 1E is a cross-sectional view of the cavity 104 within the frame 102 of the clamping assembly tray 100 of FIG. 1A in accordance with another example. Elements of FIG. 1D that are the same or similar to those of FIG. 1B are designated with identical reference numerals. In the present example, the compressible member 105 comprises an elastic material 120, rather than a plurality of springs or a plurality of elastic objects. In general, the elastic material 120 can have various shapes (e.g., rectangular shape is shown in FIG. 1E) and is configured to store and release stresses similar to springs and elastic objects. The elastic material 120 is configured to restore to an initial shape absent applied force. The elastic material 120 can be any type of elastic material known in the art.

Figure 2:
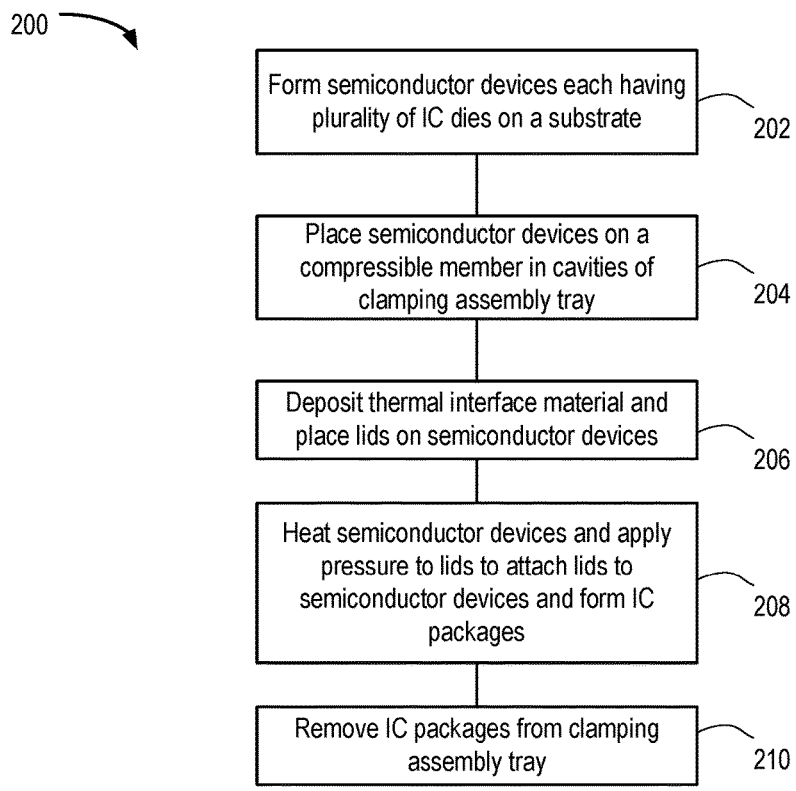
FIG. 2 is a flow diagram depicting an IC package assembly process according to an example.
Figure 3:
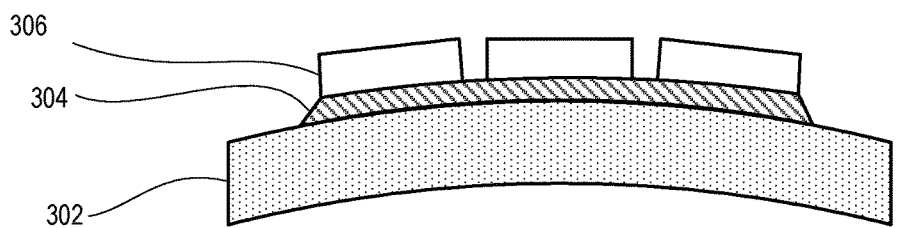
FIG. 3 is a cross-sectional view of a semiconductor device according to an example.

FIG. 2 is a flow diagram depicting an IC package assembly process 200 according to an example. The process 200 can be performed using well-known semiconductor manufacturing tools, including one or more robots, chambers, and the like. The process 200 begins at step 202, where the semiconductor manufacturing tools form semiconductor devices each having a plurality of IC dies disposed on a substrate. FIG. 3 is a cross-sectional view of a semiconductor device 300 according to an example. The semiconductor device 300 includes a substrate 302, which can be a package substrate, interposer, or the like. The substrate 302 can be any type of organic substrate, inorganic substrate, substrate having an embedded glass or silicon carrier, or the like known in the art. The semiconductor device 300 includes a plurality of IC dies 306 electrically and mechanically mounted to the substrate 302. The IC dies 306 can be homogeneous (i.e., all the same type of dies) or heterogeneous (e.g., different types of dies). Each IC die 306 can be a programmable IC (e.g., field programmable gate array (FPGA), complex programmable logic device (CPLD), etc.), application specific integrated circuit (ASIC) (e.g., a memory, processor, etc.), or the like. The IC dies 306 are electrically connected to the substrate 302 through terminals (not shown), such as solder balls, solder bumps, or the like. The semiconductor device 300 includes an encapsulating material 304 (e.g., underfill or the like) surrounding the electrical connections between the IC dies 306 and the substrate 302. At room temperature, the substrate 302 has a convex curvature with respect to the IC dies 306.

Returning to FIG. 2, at step 204, the semiconductor manufacturing tools place the semiconductor devices on the compressible member 105 in the cavities 104 of the clamping assembly tray 100. At step 206, the semiconductor manufacturing tools deposit thermal interface material and place lids on the semiconductor devices within the cavities 104 of the clamping assembly tray 100.

Figure 4A:
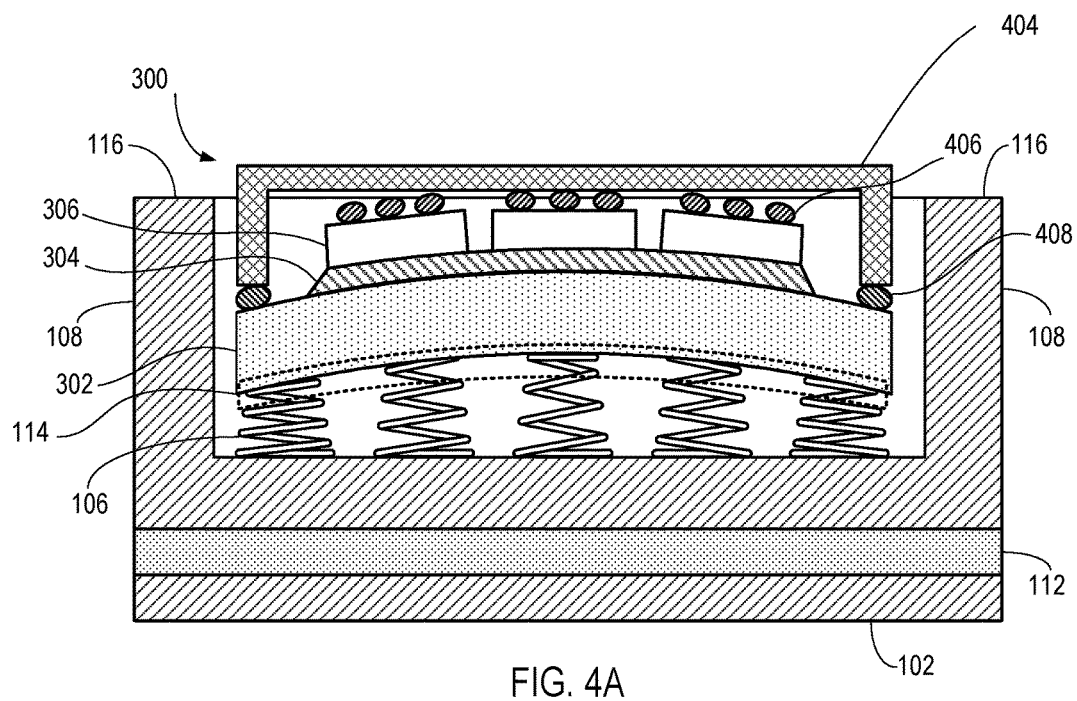
FIG. 4A is a cross-sectional view of a semiconductor device disposed within a cavity of the clamping assembly tray according to an example.

FIG. 4A is a cross-sectional view of the semiconductor device 300 disposed within a cavity 104 of the clamping assembly tray 100 according to an example. Thermal interface material 406 is deposited on the top surfaces of the IC dies 306. Adhesive material 408 is deposited on the top surface of the substrate 302. A lid 404 is placed on the semiconductor device 300 in contact with the adhesive material 408. The lid 404 is formed of metal and can function as a heat spreader and/or stiffener. The lid 404 also protects the IC die 306. As described above, the substrate 302 has a convex curvature with respect to the IC dies 306 at room temperature. In the present example, the compressible member 105 comprises the plurality of springs 106. The springs 106 conform to the bottom surface of the substrate 302 (e.g., the support surface 114 formed from the top portions of the springs 106 conforms to the bottom surface of the substrate 302). Those skilled in the art understand that other examples of the compressible member 105 described herein function similarly to the springs 106.

Returning to FIG. 2, at step 208, the semiconductor manufacturing tools heat the semiconductor devices and apply pressure to the lids to attach the lids to the semiconductor devices and form IC packages.

Figure 4B:
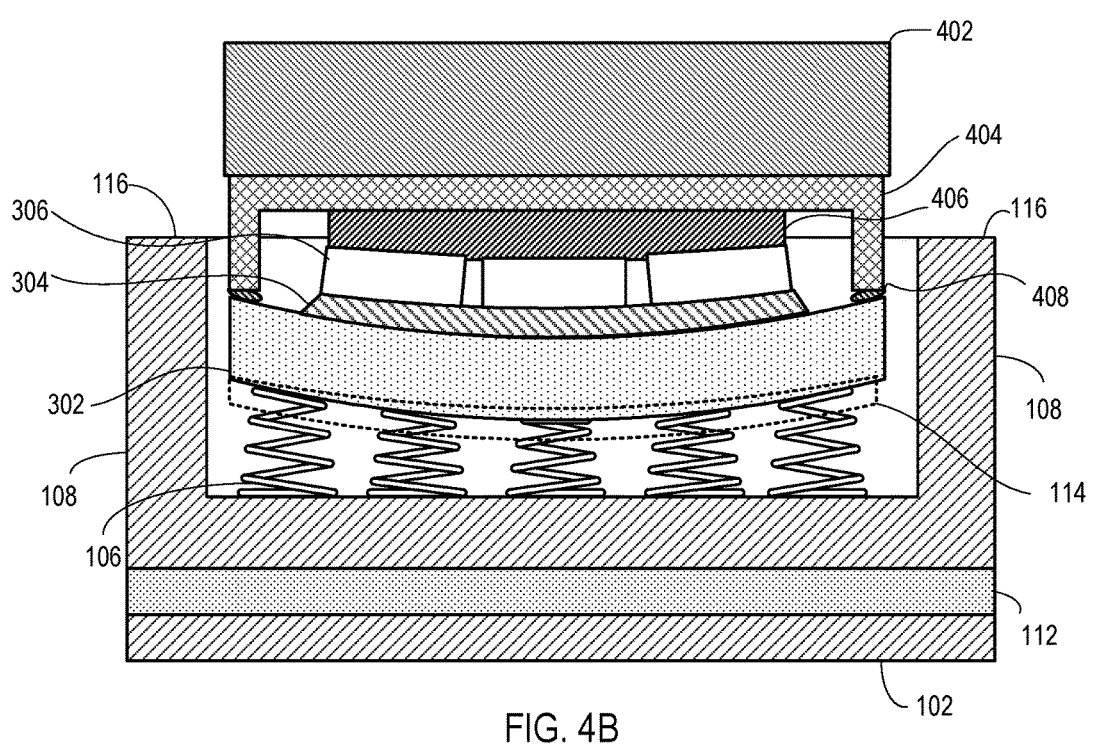
FIG. 4B is a cross-sectional view of a semiconductor device disposed within a cavity of the clamping assembly tray during heating according to an example.

FIG. 4B is a cross-sectional view of the semiconductor device 300 disposed within a cavity of the clamping assembly tray 100 during heating according to an example. A weight 402 is disposed on a top surface of the lid 404 to apply pressure to the lid 404. The weight 402 is part of the cover of the clamping assembly tray 100. The heating element 112 radiates heat, which conducts through the frame 102 and the springs 106 to the semiconductor device 300. The heat applied by the heating element 112 spreads the thermal interface material 406. The weight 402 presses the lid 404 down to contact the thermal interface material 406. Through application of heat and pressure, a layer of the thermal interface material 406 is formed between the IC dies 306 and the lid 404. When the semiconductor device 300 is heated, the curvature of the substrate 302 changes from convex with respect to the IC dies 306 to concave with respect to the IC dies 306. The springs 106 conform to the bottom surface of the substrate 302 throughout the heating process as the curvature of the substrate 302 changes (e.g., the support surface 114 formed from the top portions of the springs 106 conforms to the bottom surface of the substrate 302 throughout the heating process).

Returning to FIG. 2, at step 210, the IC packages are removed from the clamping assembly tray. In particular, the semiconductor manufacturing tools discontinue applying heat through the heating element 112 and remove the weights 402. The semiconductor manufacturing tools then remove the IC packages from the cavities 104 of the frame 102. Each IC package includes a semiconductor device 300 and a lid 404.

For successful packaging of the semiconductor device 300, the top surface of the lid 404 should be substantially parallel with the top surfaces of the IC dies 306 to within a given tolerance (e.g., 4 mils). Further, the thermal interface material 406 should substantially cover the IC dies 306 within a given tolerance (e.g., at least 95% of the surface area of the IC dies 306). Further, the thermal interface material 406 thickness should be substantially uniform (e.g., a thickness of 100 micrometers). To accomplish such requirements, the assembly process needs to apply mechanical force at higher than room temperature, as described above. Conventionally, this can lead to die cracking and delamination for various reasons, discussed below.

Notably, at room temperature, the substrate of the semiconductor device includes a curvature that changes as the semiconductor device is heated. The lid can also have a non-uniform flatness. The bottom of each cavity in the clamping assembly tray can also have a non-uniform flatness. The weight applied during the packaging process can also have a non-uniform flatness. These factors can lead to application of non-uniform force and non-uniform heat to the IC package during the assembly process. Such application of non-uniform force and heat results in mechanical stresses on the IC package, causing cracks and/or delamination of the lid from the semiconductor device. Further, the thermal interface material between the lid and the IC dies will not be uniform and can include air pockets that create higher thermal resistance in certain locations of the IC dies.

The example clamping assembly tray 100 described above includes a dynamic balancing mechanism in the form of the springs 106, the elastic objects 118, the elastic material 120, or any other type of compressible member 105. The frame 102 of the tray 100 includes a series of cavities 104 to host multiple semiconductor devices 300. The cavities 104 can be sized to accommodate semiconductor devices of various sizes. The compressible member 105 balances the force applied to the IC package during the assembly process to ensure constant and uniform pressure despite any variation in flatness of the bottom 110, the lid 404, and the weight 402. Further, the compressible member 105 provides for uniform heating of the IC package during the assembly process. The thermal interface material 406 spreads in a uniform fashion, resulting in a layer of the thermal interface material 406 having a uniform thickness.

Figure 5:
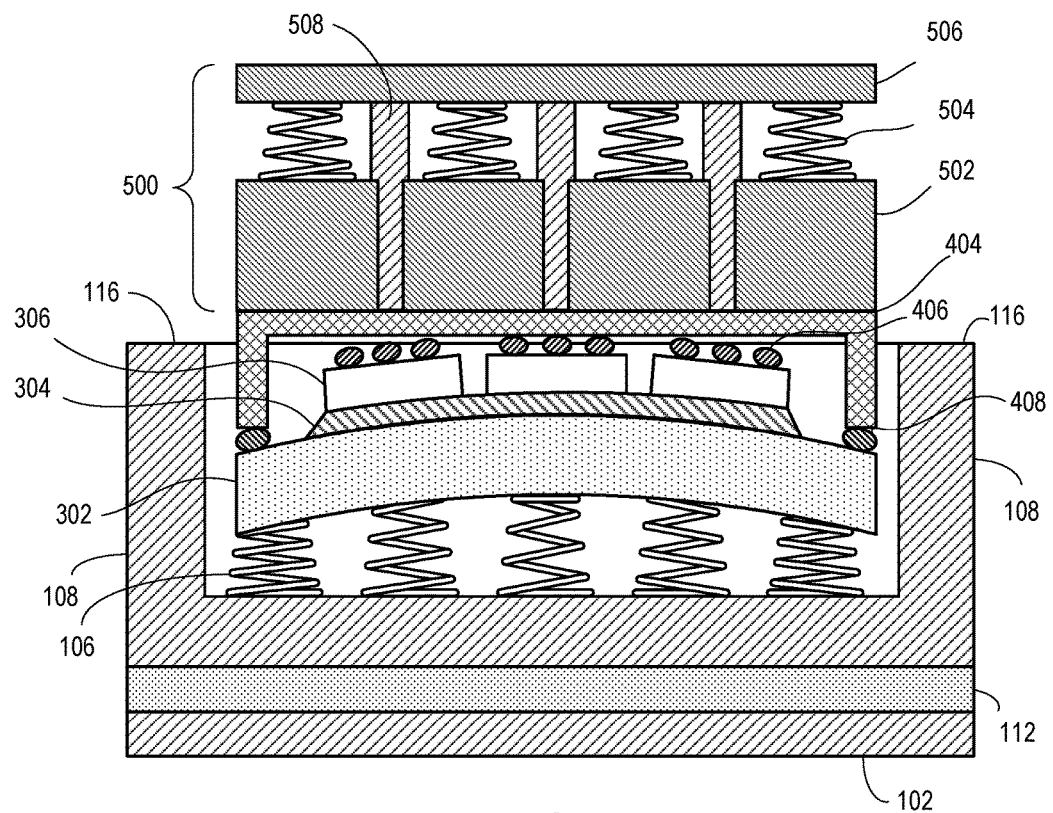
FIG. 5 is a cross-sectional view of a semiconductor device disposed within a cavity of the clamping assembly tray according to another example.
Figure 6:
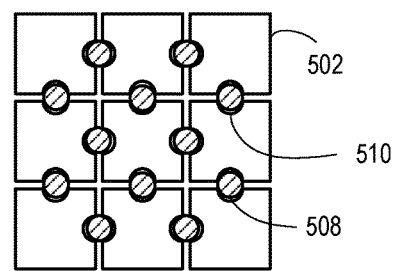
FIG. 6 is a top view of a weight assembly according to an example.

FIG. 5 is a cross-sectional view of the semiconductor device 300 disposed within a cavity 104 of the clamping assembly tray 100 according to another example. In the present example, the weight 402 is replaced by weight assembly 500. The weight assembly 500 can be part of the cover of the clamping assembly tray 100. The weight assembly 500 includes a top portion 506, compressible members 504, weights 502, and elongate members 508. The top portion 506 can be formed of metal. In the example shown, the compressible members 504 comprise springs, both other types of elastic objects or elastic materials can be used. One side of each of the compressible members 504 is bonded to the top portion 506. An opposite side of each of the compressible members 504 is bonded to a weight 502. The elongate members 508 are integral with the top portion 506 and are disposed between the weights 502. Each weight 502 can independently move up and down along the elongate members 508. FIG. 6 is a top view of the weight assembly 500 according to an example. As shown in FIG. 6, each of the weights includes notches 510 that conform to the elongate members 508. In the present example, the elongate members 508 have a cylindrical shape.

When the weight assembly 500 is placed on the lid 404, the weights 502 contact the top surface of the lid 404. As noted above, the top surface of the lid 404 may not have a uniform flatness. The weights 502 conform to top surface of the lid 404 through compression of the compressible members 504. This results in more uniform pressure applied to the lid 404 despite any non-uniform flatness of the lid 404. The weight assembly 500 can be used in place of the weight 402 in the assembly process described above.

While the foregoing is directed to specific examples, other and further examples may be devised without departing from the basic scope thereof, and the scope thereof is determined by the claims that follow.

What is claimed is:

1. A clamping assembly tray for packaging a semiconductor device, comprising:
 a frame having a bottom surface and side walls extending from the bottom surface that define a cavity;
 a compressible member disposed on the bottom surface of the frame within the cavity, where a top portion of the compressible member provides a support surface for supporting the semiconductor device, the support surface being between the bottom surface and a top edge of the side walls;
 a heating element disposed in the frame beneath the bottom surface.

2. The clamping assembly tray of claim 1, wherein the compressible member comprises a plurality of springs.

3. The clamping assembly tray of claim 2, wherein each of the plurality of springs is formed of metal.

4. The clamping assembly tray of claim 3, wherein each of the plurality of springs is bonded to the bottom surface of the frame using a weld or solder.

5. The clamping assembly tray of claim 1, wherein the compressible member comprises a plurality of elastic objects.

6. The clamping assembly tray of claim 1, wherein the compressible member comprises an elastic material.

7. An apparatus for assembling an integrated circuit (IC) package, comprising:
 a frame having a bottom surface and side walls extending from the bottom surface that define a cavity;

a compressible member disposed on the bottom surface of the frame within the cavity, where a top portion of the compressible member provides a support surface, the support surface being between the bottom surface and a top edge of the side walls;

a semiconductor device disposed on the support surface within the cavity, the semiconductor device comprising a substrate and a plurality of integrated circuit (IC) dies mounted to the substrate;

a lid disposed on the semiconductor device; and thermal interface material disposed between the plurality of IC dies and the lid.

8. The apparatus of claim 7, further comprising:
a weight disposed on top of the lid.

9. The apparatus of claim 7, further comprising:
a heating element disposed in the frame beneath the bottom surface.

10. The apparatus of claim 7, wherein the substrate includes a curved surface and wherein the support surface of the compressible members conforms to the curved surface of the substrate.

11. The apparatus of claim 7, further comprising:
a weight assembly disposed on top of the lid, the weight assembly including:
a top member;
a plurality of weights; and
another plurality of compressible members disposed between the top member and the plurality of weights, each of the other plurality of compressible members attached to the top member and to one of the plurality of weights.

12. The apparatus of claim 11, wherein the weight assembly further comprises a plurality of elongate members integral with the top member and disposed between the plurality of weights.

13. The apparatus of claim 7, wherein the compressible member comprises plurality of springs.

14. The apparatus of claim 7, wherein the compressible member comprises a plurality of elastic objects.

15. The apparatus claim 7, wherein the compressible member comprises an elastic material.

16. An apparatus for assembling an integrated circuit (IC) package, comprising:
a frame having a bottom surface and side walls extending from the bottom surface that define a cavity;
a compressible member disposed on the bottom surface of the frame within the cavity, where a top portion of the compressible member provides a support surface, the support surface being between the bottom surface and a top edge of the side walls;
a semiconductor device disposed on the support surface within the cavity;
a lid disposed on the semiconductor device; and
a weight disposed on top of the lid.

* * * * *